(12) United States Patent
Mu

(10) Patent No.: US 12,439,677 B2
(45) Date of Patent: Oct. 7, 2025

(54) METHOD FOR MANUFACTURING SEMICONDUCTOR DEVICE, AND SEMICONDUCTOR DEVICE

(71) Applicant: CHANGXIN MEMORY TECHNOLOGIES, INC., Hefei (CN)

(72) Inventor: Kejun Mu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 507 days.

(21) Appl. No.: 17/867,835

(22) Filed: Jul. 19, 2022

(65) Prior Publication Data
US 2023/0049320 A1    Feb. 16, 2023

Related U.S. Application Data

(63) Continuation of application No. PCT/CN2021/128320, filed on Nov. 3, 2021.

(30) Foreign Application Priority Data

Aug. 16, 2021  (CN) .................... 202110937661.7

(51) Int. Cl.
*H10D 64/27* (2025.01)
*H01L 21/02* (2006.01)
(Continued)

(52) U.S. Cl.
CPC ..... *H10D 64/514* (2025.01); *H01L 21/02236* (2013.01); *H01L 21/31111* (2013.01); *H10D 64/01* (2025.01); *H10D 64/661* (2025.01)

(58) Field of Classification Search
CPC ......... H01L 29/42364; H01L 21/02236; H01L 21/31111; H01L 29/401; H01L 29/4916
See application file for complete search history.

(56) References Cited

U.S. PATENT DOCUMENTS

| 5,898,207 A  * | 4/1999 | Takase ..................... H10D 1/68 |
|  |  | 257/E21.396 |
| 6,548,331 B2 | 4/2003 | Lee |

(Continued)

FOREIGN PATENT DOCUMENTS

| CN | 1355554 A   | 6/2002 |
| CN | 102135674 A | 7/2011 |
| CN | 101866868 B | 10/2011 |

OTHER PUBLICATIONS

Tomokazu Ohchi, et al. Reducing Damage to Si Substrates during Gate Etching Processes. Japanese Journal of Applied Physics 2008, 47(7).

(Continued)

*Primary Examiner* — Zandra V Smith
*Assistant Examiner* — Andre C Stevenson

(57) ABSTRACT

Disclosed is a method for manufacturing a semiconductor device. The method includes: forming a gate insulating material layer on a substrate; forming a gate material layer on the gate insulating material layer; and performing an etching process on the gate material layer and the gate insulating material layer to form a gate layer and a gate insulating layer. The gate insulating layer and the gate layer each include a first end and a second end opposite to each other in a direction parallel to a channel length. The first end of the gate insulating layer is recessed inwards by a preset length relative to the first end of the gate layer, and the second end of the gate insulating layer is recessed inwards by the preset length relative to the second end of the gate layer.

4 Claims, 12 Drawing Sheets

(51) Int. Cl.
*H01L 21/311* (2006.01)
*H10D 64/01* (2025.01)
*H10D 64/66* (2025.01)

(56) References Cited

U.S. PATENT DOCUMENTS

| | | | |
|---|---|---|---|
| 6,586,287 B2 | 7/2003 | Joo | |
| 7,728,328 B2 | 6/2010 | Kwak | |
| 8,324,109 B2 | 12/2012 | Kim | |
| 8,501,566 B1 * | 8/2013 | Chou | H10B 12/053 438/269 |
| 2002/0068392 A1 | 6/2002 | Lee | |
| 2002/0142528 A1 | 10/2002 | Joo | |
| 2004/0126914 A1 | 7/2004 | Chang | |
| 2007/0018238 A1 * | 1/2007 | Ono | H10D 64/685 257/327 |
| 2007/0145369 A1 | 6/2007 | Kwak | |
| 2008/0099833 A1 * | 5/2008 | Rouh | H10D 64/516 257/E29.345 |
| 2008/0315290 A1 * | 12/2008 | Lee | H10D 30/6893 257/E21.21 |
| 2012/0086056 A1 * | 4/2012 | Beyer | H01L 21/32139 257/288 |

OTHER PUBLICATIONS

J.Niess, et al. Highly Reliable Rapid Thermal Selective Gate Re-Oxidation Process of Advanced Metal Gate Stacks With Tungsten Electrode. 2007 15th International Conference on Advanced Thermal Processing of Semiconductors, Cannizzaro, Italy, 2007, pp. 209-214.

M.G Sung, et al. Low resistive tungsten dual poly-metal gates with multi-diffusion barrier metals in high performance memory devices. Solid-State Electronics 2012, 69.

G.W Lee, et al. Characterization of Polymetal Gate Transistors With Low-Temperature Atomic-Layer-Deposition-Grown Oxide Spacer. IEEE Electron Device Letters 2009, 30(2).

* cited by examiner

METHOD FOR MANUFACTURING SEMICONDUCTOR DEVICE, AND SEMICONDUCTOR DEVICE

CROSS-REFERENCE TO RELATED APPLICATION

This application is a U.S. continuation application of International Application No. PCT/CN2021/128320 filed on Nov. 3, 2021, which claims priority to Chinese patent application No. 202110937661.7 filed on Aug. 16, 2021. The disclosure of these applications are hereby incorporated by reference in their entirety.

TECHNICAL FIELD

Embodiments of the disclosure relate to, but are not limited to, a method for manufacturing a semiconductor device, and a semiconductor device.

BACKGROUND

A gate stack structure is an essential part of a transistor. In the related art, the gate stack structure is generally manufactured by first depositing a gate insulating material layer and a gate material layer on a substrate, and then patterning and etching on the material layers to form a gate insulating layer and a gate layer. The above etching process will cause a certain degree of damage to a surface of the substrate, and side surfaces of the gate insulating layer and the gate layer. To repair the damage, the traditional practice is to perform a reoxidation process after the etching process.

However, there is a problem that an effective channel length is decreased alter the gate stack structure manufactured in the related art is subjected with the reoxidation process.

SUMMARY

Embodiments of the disclosure provide a method for manufacturing a semiconductor device. The method includes the following operations.

A gate insulating material laver is formed on a substrate.

A gate material layer is formed on the gate insulating material layer.

An etching process is performed on the gate material layer and the gate insulating material layer to form a gate layer and a gate insulating layer.

The gate insulating layer and the gate layer each include a first end and a second end opposite to each other in a direction parallel to a channel length, the first end of the gate insulating layer is recessed inwards by a preset length relative to the first end of the gate layer, and the second end of the gate insulating layer is recessed inwards by the preset length relative to the second end of the gate layer.

Embodiments of the disclosure further provide a semiconductor device. The semiconductor device includes: a substrate; a gate insulating layer located on the substrate, and including a first end and a second end opposite to each other in a direction parallel to a channel length; and a gate layer located on the gate insulating layer and including a first end and a second end opposite to each other in the direction parallel to the channel length. The first end of the gate insulating layer is recessed inwards by a preset length relative to the first end of the gate layer, and the second end of the gate insulating layer is recessed inwards by the preset length relative to the second end of the gate layer.

DETAILED DESCRIPTION

Figure 1A:
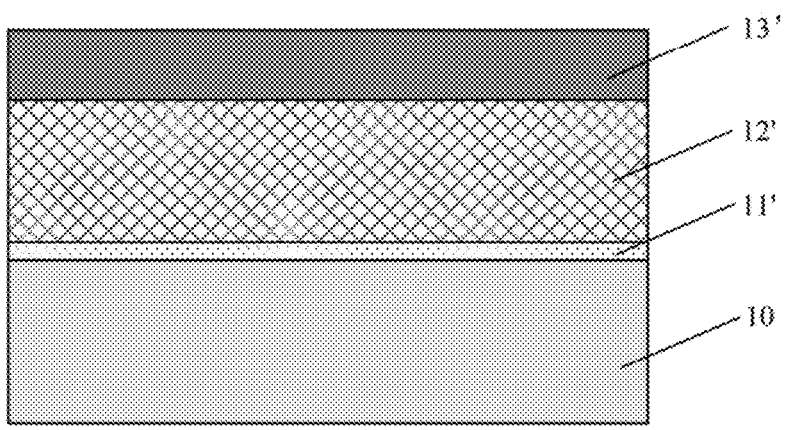
FIG. 1A to FIG. 1C show flow diagrams of a method for manufacturing a semiconductor device in the related art.

Exemplary embodiments disclosed in the disclosure are described in More detail with reference to drawings. Although the exemplary embodiments of the disclosure are shown in the drawings, it should be understood that the disclosure may be implemented in various forms and should not be limited by the specific embodiments described here. On the contrary, these embodiments are provided for more fully understanding of the disclosure, and to completely convey a scope disclosed by the disclosure to a person skilled in the art.

In the following description, numerous specific details are given in order to provide a more thorough understanding of the disclosure. However, it is apparent to persons skilled in the art that the disclosure may be implemented without one or more of these details, in other examples, in order to avoid confusion with the disclosure, some technical features well known in the art are not described. That is, not all the features of the actual embodiments are described herein, and well-known functions and structures are not described in detail.

In the drawings, the sizes of a layer, a region, and an element and their relative sizes may be magnified for clarity. The same reference sign represents the same element throughout.

It should be understood that while the element or the layer is referred to as being "on . . . ", "adjacent to . . . ". "connected to . . . " or "coupled to . . . " other elements or layers, it may be directly on the other elements or layers, adjacent to, connected or coupled to the other elements or layers, or an intermediate element or layer may be present, in contrast, while the element is referred to as being "directly on . . . ,", "directly adjacent to . . . ,", "directly connected to . . . " or "directly coupled to . . . " other elements or layers, the intermediate element or layer is not present. It should be understood that although terms "first", "second", "third" and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. While the second element, component, region, layer or section is discussed, it does not mean that the first element, component, region, layer or section is necessarily present in the disclosure.

Spatial relation terms, such as "under . . . ", "below . . . ", "lower", "underneath . . . ", "above . . . ", "upper" and the like, may be used here for conveniently describing a relationship between one element or feature shown in the drawings and other elements or features. It should be understood that in addition to orientations shown in the drawings, the spatial relation terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below . . . " and "under . . . " may include two orientations of up and down. The device may be otherwise oriented (rotated by 90 degrees or other orientations) and the spatial relation terms used here are interpreted accordingly.

The terms used here are only intended to describe the specific embodiments and are not limitations to the disclosure. As used herein, singular forms of "a", "an" and "said/the" are also intended to include plural forms, unless otherwise clearly indicated in the context. It should also be understood that terms "composing" and/or "including", while used in the description, demonstrate the presence of the described features, integers, steps, operations, elements and/or components, but do not exclude the presence or addition of one or more other features, integers, steps, operations, elements, components, and/or groups. As used herein, a term "and/or" includes any and all combinations of related items listed.

A conventional method for forming a gate stack structure includes the following operations. First, a gate insulating material layer and a gate material layer are formed on the semiconductor substrate and cover the semiconductor substrate. Next, the gate insulating material layer and the gate material layer are patterned by etching to form a gate stack structure consisting of a gate insulating layer and a gate layer. The above etching process will cause a certain degree of damage to the surface of the substrate and the side surface of the gate stack structure, and thus affect the integrity and the electrical quality of the gate stack structure. For example, high electric fields may be generated in an area of the gate insulating layer adjacent to a bottom of the gate layer, which affects the reliability of the gate insulating layer. Moreover, a leakage current between the gate layer and the substrate below same may be increased.

To repair the etching damage of the gate stack structure caused in the above etching process, the researchers tried to perform a reoxidation process on the gate stack structure after etching.

Figure 1B:
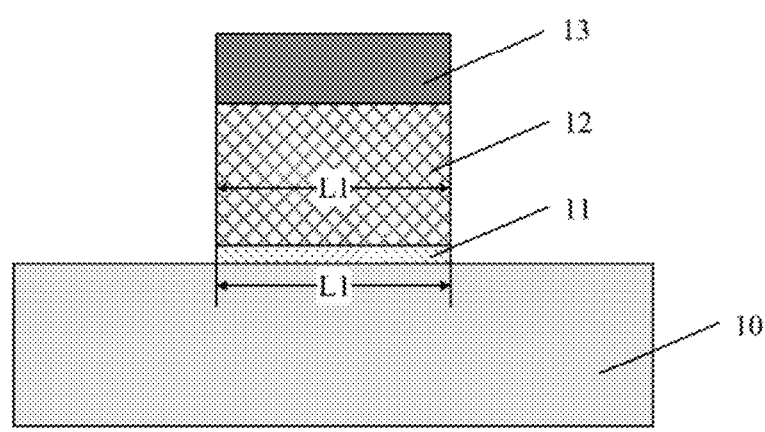
Figure 1C:
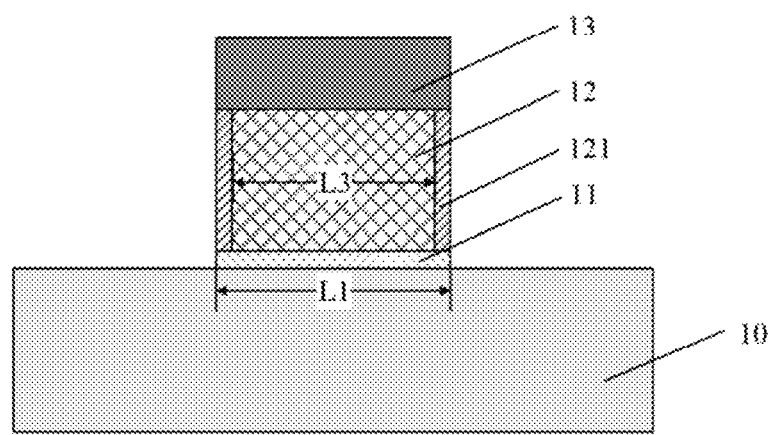

FIG. 1A to FIG. 1C show flow diagrams of a method for manufacturing of a semiconductor device in the related art.

First, as shown in FIG. 1A, a gate insulating material layer 11' is first formed on a substrate 10 and covers an upper surface of the substrate 10. Next, a gate material layer 12' is formed on the gate insulating material layer 11' A cap material layer 13' may be formed on the gate material layer 12' after forming the gate material layer 12'.

Next, as shown in FIG. 1B, the gate insulating material layer 11', the gate material layer 12, and the cap material layer 13' are patterned by etching to form a gate stack structure including a gate insulating layer 11 and a gate layer 12, and a cap layer 13. Specifically, before etching, a patterned mask layer (not shown in the drawing) may be formed on the cap material layer 13' and then the etching process is performed. Both the gate insulating layer 11 and the gate layer 12 have an initial length of L1.

When the etching process is performed to form the gate stack structure, a certain degree of damage may be caused to a surface of the substrate 10 and a side surface of the gate stack structure, and thus causes the change in the device characteristics, e.g. the instability of a threshold voltage (Vth) or the decrease of the reliability.

Therefore, it is necessary to perform a repair process on the gate stack structure suffering from the etching damage. At present, the common repair process is a gate reoxidation process. The gate reoxidation process can not only repair the etching damage of the gate stack structure, but also increase a thickness of a gate oxide in a gate edge area to reduce a Gate-Induced Drain Leakage (GIDL) phenomenon. As shown in FIG. 1C, the reoxidation process is performed on the gate stack structure, to oxidize two ends of the gate layer to generate an oxidation layer. In this case, a length of the gate insulating layer is L1, and an actual length of the gate is changed to L3 less than L1. That is to say, the actual length of the gate is less than the length of the gate insulating layer. That is, an actual length of the channel is less than the preset length of the channel, and an effective length of the channel of a transistor is decreased.

On this basis, embodiments of the disclosure provide the following technical solutions.

Figure 2:
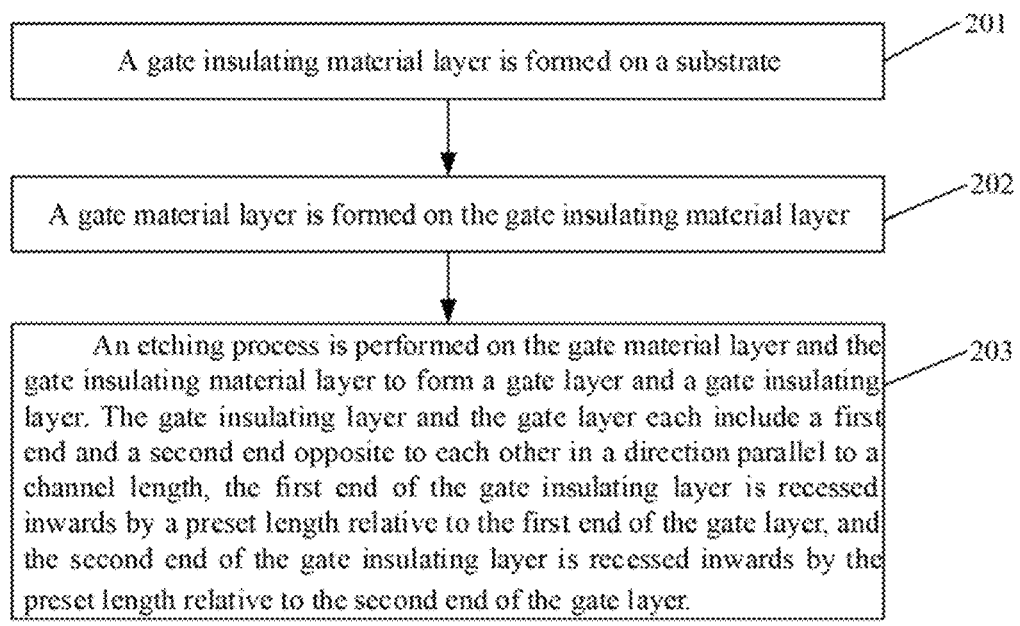
FIG. 2 shows a flowchart of a method for manufacturing, a semiconductor device according to embodiments of the disclosure.

Embodiments of the disclosure provide a method for manufacturing a semiconductor device. See FIG. 2 for details. As shown in FIG. 2, the method includes the following steps.

At step 201, a gate insulating material layer is formed on a substrate.

At step 202, a gate material layer is formed on the gate insulating material layer.

At step 203, an etching process is performed on the gate material layer and the gate insulating material layer to form a gate layer and a gate insulating layer.

The gate insulating layer and the gate layer each include a first end and a second end opposite to each other in a direction parallel to a channel length. The first end of the gate insulating layer is recessed inwards by a preset length relative to the first end of the gate layer, and the second end of the gate insulating layer is recessed inwards by the preset length relative to the second end of the gate layer.

In the method, in the direction parallel to the channel length, two ends of the gate layer have protruding length parts with respect to two ends of the gate insulating layer. That is, the gate layer has an initial length larger than that of the gate insulating layer. Therefore, when the subsequent reoxidation process is performed, the first end and the second end of the gate layer are oxidized to form an oxidation layer, which does not cover the gate insulating layer, so that the actual gate length is equal to the preset channel length, thereby not causing the decrease of the effective channel length.

To make the objectives, features, and advantages of the disclosure clearer and easier to understand, the following further describes specific implementations of the disclosure in detail with reference to the accompanying drawings. To facilitate describing embodiments of the disclosure in detail, diagrams may be partially enlarged not in accordance with the general scale. In addition, the diagrams are merely examples, and should not limit the scope of protection of the disclosure.

FIG. 3A to FIG. 3E show flow diagrams of a method for manufacturing a semiconductor device according to embodiments of the disclosure.

Figure 3A:
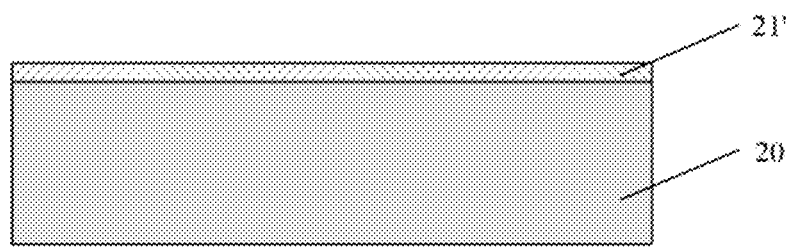
FIG. 3A to FIG. 3E show flow diagrams of a method for manufacturing a semiconductor device according to embodiments of the disclosure.

First, as shown in FIG. 3A, step 201 is performed. That is, a gate insulating material layer 21' is formed on a substrate 20. It can be understood that in some embodiments, other structures such as a buffer layer may be included between the substrate 20 and the gate insulating material, layer 21, which are not specifically limited herein.

In an actual process, the substrate is located at a bottom of the gate insulating material layer 21', and thus can play a supporting function in the subsequent process of forming) a stack structure.

Here the substrate may be a semiconductor substrate, specifically, may include at least one elemental semiconductor material (e.g. a silicon (Si) substrate and a germanium (Ge) substrate), at least one 1-V compound semiconductor material (e.g. a gallium nitride (GaN) substrate, a gallium arsenide (GaAs) substrate, and an indium phosphide (InP) substrate), at least one II-VI compound semiconductor material, at least one organic semiconductor material, or other semiconductor materials known in the art. In one specific embodiment, the substrate is a silicon substrate.

The gate insulating material layer may be made of a high dielectric constant material, and can provide electrical insulation between the substrate and the subsequently formed gate layer. The gate insulating material layer may be made of silicon oxide or other materials.

Figure 3B:
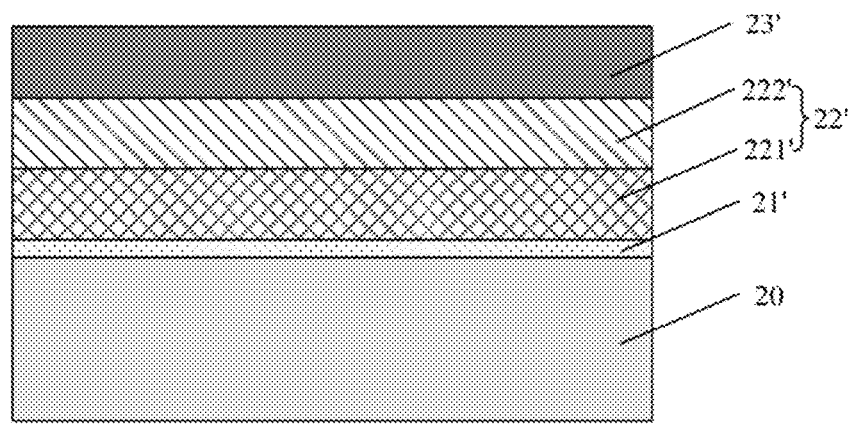

Next, step 202 is performed. As shown in FIG. 3B, a gate material layer 22' is formed on the gate insulating material layer 21'.

In one embodiment, the gate material layer 22' includes a polysilicon material layer 221' and a metal material layer 222'. The formation of the gate material layer 22' on the gate insulating material layer 21' includes: forming the polysilicon material laser 221' on the gate insulating material layer 21'; and forming the metal material layer 222' on the polysilicon material layer 221'. Not limited to this, the gate material layer 22' may only include one of the polysilicon material layer 221' and the metal material layer 222' That is, the gate material layer 22' may be the polysilicon material layer 221' or the metal material layer 222'. In one specific embodiment, the material of which the metal material layer 222' is made includes, but is not limited to, metal tungsten, metal silicide, tungsten nitride, etc. The metal silicide may include $TiSi_2$, $CoSi_2$, $NiSi_2$, etc.

In one embodiment, as shown in FIG. 3B, a cap material layer 23' is formed on the gate material layer 22' after forming the gate material layer 22'. The cap material layer 23' is used for protecting the gate material layer 22', and includes, but is not limited to, silicon oxide, silicon nitride, etc.

The gate insulating material layer 21' and the gate material layer 22' may be formed by using one or more thin film deposition processes. Specifically, the thin film deposition process includes, but is not limited to, a Chemical Vapor Deposition (CVD) process, a Plasma-Enhanced Chemical Vapor Deposition (PECVD) process, an Atomic Layer Deposition (ALD) process, or a combination thereof.

Figure 3C:
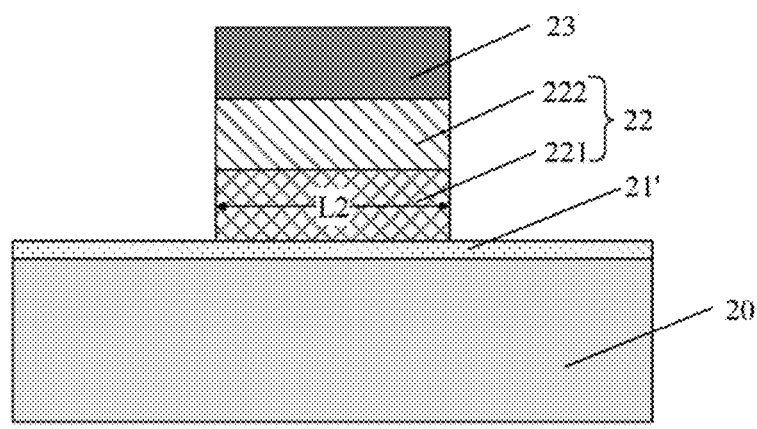
Figure 3D:
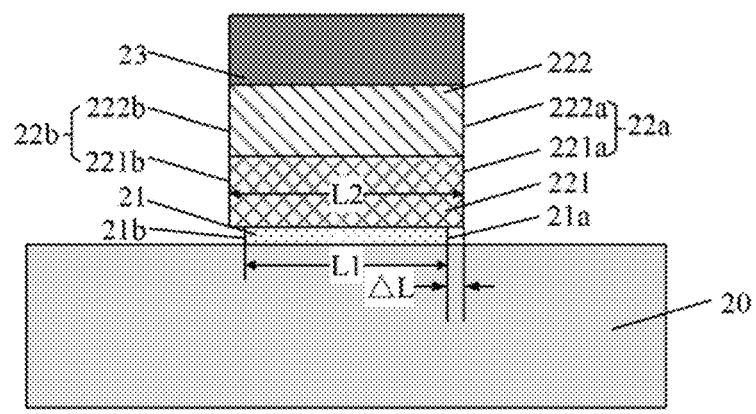

Next, step 203 is performed. As shown in FIG. 3C and FIG. 3D, the gate material layer 22' and the gate insulating material layer 21' are etched to form a gate layer 22 and a gate insulating layer 21.

Each of the gate insulating layer 21 and the gate layer 22 includes a first end and a second end opposite to each other in a direction parallel to a channel length. The first end 21a of the gate insulating layer 21 is recessed inwards by a preset length ΔL relative to the first end 22a of the gate layer 22, and the second end 21b of the gate insulating layer 21 is recessed inwards by the preset length ΔL relative to the second end 22b of the gate layer 22.

In one embodiment, the step that the gate material layer 22' and the gate insulating maternal layer 21' are etched includes the following operations.

A patterned mask layer (not shown in the drawing) is formed on the gate material layer 22'. An anisotropic etching process is performed on the gate material layer 22' by using the patterned mask layer as a mask to form the gate layer 22, as shown in FIG. 3C. By continuing using the patterned mask layer as a mask, an isotropic etching process is performed on the gate insulation material layer 21' to form the gate insulating material layer 21, as shown in FIG. 3D.

In the embodiment, the gate material layer 22' and the gate insulating material layer 21' are etched by using the same mask layer through different etching means, so that two ends 21a and 21b of the finally formed gate insulating layer 21 are recessed inwards by a preset length ΔL relative to two ends 22a and 22b of the gate layer 22, respectively. In other words, the first end 21a of the finally formed gate insulating layer 21 is recessed inwards by a preset length ΔL relative to the first end 22a of the gate layer 22, and the second end 21b of the gate insulating layer 21 is recessed inwards by the preset length ΔL relative to the second end 22b of the gate layer 22. It should be noted that a numerical value of the preset length ΔL is not particularly limited, and is relevant to a thickness of the oxidation layer formed in the subsequent reoxidation process.

In one specific embodiment, the operation that an anisotropic etching process is performed on the gate material layer 22' includes: sequentially performing an etching process on the metal material layer 222' and the polysilicon material layer 221' to obtain a metal layer 222 and a polysilicon layer 221. The first end 22a of the gate layer 22 includes a first end 221a of the polysilicon layer 221 and a first end 222a of the metal layer. The second end 22b of the gate layer 22 includes a second end 221b of the polysilicon layer 221 and a second end 222b of the metal layer. The first end 222a of the metal layer 222 is flush with the first end 221a of the polysilicon layer 221 in a perpendicular direction, and the second end 222b of the metal layer 222 is flush with the second end 221b of the polysilicon layer 221 in the perpendicular direction.

In one specific embodiment, the anisotropic etching process includes, but is not limited to, a dry etching process, such as a plasma etching process. The isotropic etching process includes, but is not limited to, a wet etching process, such as corrosion with an acid solution.

Figure 4A:
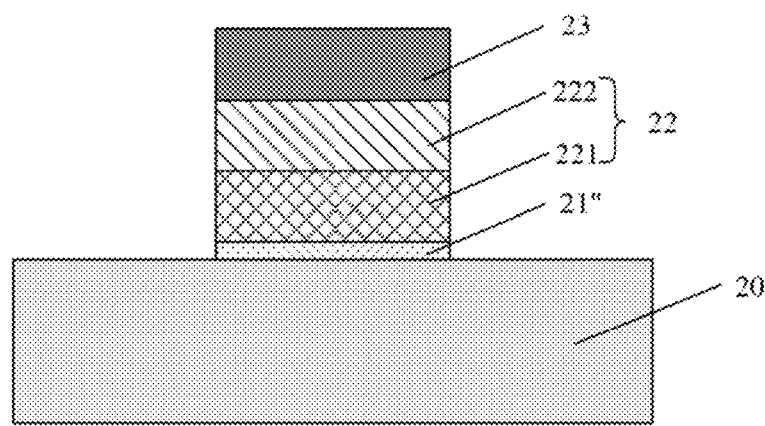
FIG. 4A and FIG. 4B schematically show the formation of a gate insulating layer and a gate layer by etching according to another embodiment of the disclosure.
Figure 4B:
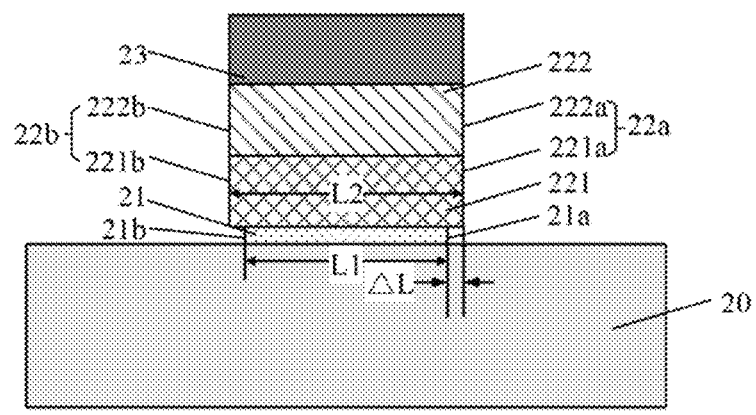

FIG. 4A and FIG. 4B show schematic diagrams of a gate insulating layer 21 and a gate layer 22 formed by etching according to another embodiment of the disclosure. As shown in the drawing, the operation that an etching process is performed on the gate material layer 22' and the gate insulating material layer 21' includes the following operations.

A patterned mask layer (not shown in the drawing) is formed on the gate material layer 22'.

By using the patterned mask layer as a mask, an anisotropic etching is performed on the gate material layer 22' and the gate insulating material layer 21' to form the gate layer 22 and a gate insulating intermediate layer 21". The gate layer 22 and the gate insulating intermediate layer 21" have a same length in the direction parallel to the channel length, as shown in FIG. 4A.

A lateral etching process is performed on the gate insulating intermediate layer 21" to form the gate insulating layer 21, as shown in FIG. 4B.

In the embodiment, two-step etching processes may be used to etch the gate material layer 22' and the gate insulating material layer 21', so that two ends 21a and 21b of the finally formed gate insulating layer 21 are recessed inwards by a preset length ΔL relative to two ends 22a and 22b of the gate layer 22, respectively. In other words, the first end 21a of the finally formed gate insulating layer 21 is recessed inwards by a preset length ΔL relative to the first end 22a of the gate layer 22, and the second end 21b of the gate insulating layer 21 is recessed inwards by the preset length ΔL relative to the second end 221 of the gate layer 22. It should be noted that a numerical value of the preset length ΔL is not particularly limited, and is relevant to a thickness of the oxidation layer formed in the subsequent reoxidation process.

In an actual process, the anisotropic etching process may be a plasma etching process. The lateral etching process may be a wet etching process.

With continuing reference to FIG. 3C, in one embodiment, before etching the gate material layer 22' and the gate insulating material layer 21', the cap material layer 23' is etched to form the cap layer 23. The etching process for the cap layer 23 may be the same as that for the gate layer 22, which is not described again here.

Figure 3E:
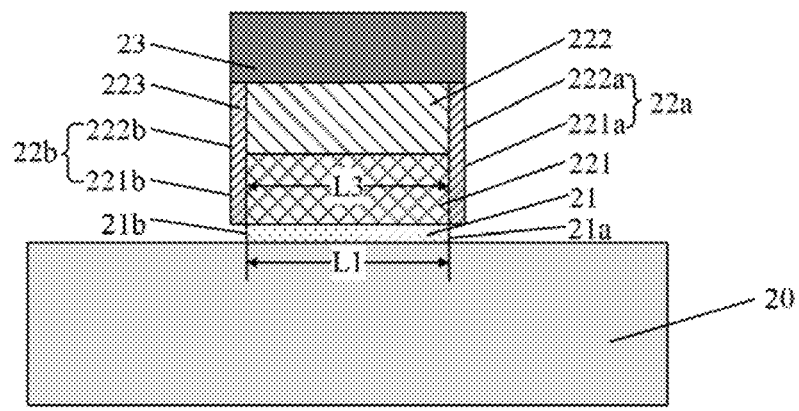

In one embodiment, after the step 203 is performed, as shown in FIG. 3E, the method further includes an operation of performing a reoxidation process. Specifically, the first end 22a and the second end 22b of the gate layer 22 are oxidized to form an oxidation layer 223. In one specific embodiment, a thickness of the oxidation layer 223 in the direction parallel to the channel length is less than or equal to the preset length ΔL. In addition, the reoxidation process can also repair damages on the surface of the substrate 20 and the side wall of the gate insulating layer 21, and increase the thickness of the oxidation layer 223 located on two ends of the gate layer 22 so as to reduce a GIDL phenomenon.

In one embodiment, a temperature of the reoxidation process is controlled to be greater than 900° C. in order to sufficiently oxidize the first end 22a and the second end 22b of the gate layer 22 to form the oxidation layer 223, and avoid the problem of further oxidation caused by insufficient oxidation of the side wall of the gate layer 22 in the subsequent process.

In another embodiment, a time of the reoxidation process is controlled to be greater than three minutes, in order to sufficiently oxidize the first end 22a and the second end 22b of the gate layer 22 to form the oxidation layer 223, and avoid the problem of further oxidation caused by insufficient oxidation of the side wall of the gate layer 22 in the subsequent process.

After the reoxidation process, the actual length of the gate is changed due to the formation of the oxidation layer. That is, the initial preset length L2 is shortened to L3 after the reoxidation process, by the step 203, two ends of the gate insulating layer are controlled to recess inwards by the preset length ΔL relative to two ends of the gate layer, so that the actual length of the finally formed gate is greater than or equal to the length of the gate insulating layer, i.e., L3≥L1.

Therefore, according to the design of embodiments of the disclosure, the effective channel length of the device would not be decreased due to the formation of the oxidation layer on the side wall of the gate layer by performing the reoxidation process on the gate stack structure.

Figure 5:
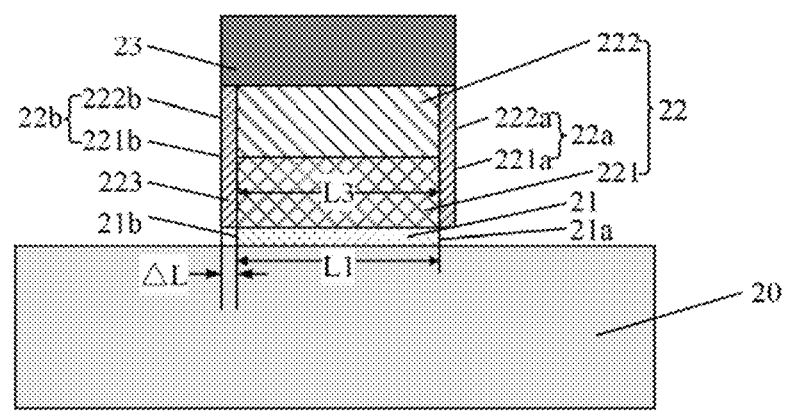
FIG. 5 schematically shows a structure of a semiconductor device according to embodiments of the disclosure.

Embodiments of the disclosure further provide a semiconductor device. As shown in FIG. 5, the semiconductor device includes: a substrate 20; a gate insulating layer 21 located on the substrate 20, and including a first end 21a and a second end 21b opposite to each other in a direction parallel to a channel length; and a gate layer 22 located on the gate insulating layer 21, and including a first end 22a and a second end 22b opposite to each other in the direction parallel to the channel length.

The first end 21a of the gate insulating layer 21 is recessed inwards by a preset length ΔL relative to the first end 22a of the gate layer 22, and the second end 21b of the gate insulating layer 21 is recessed inwards by the preset length ΔL relative to the second end 22b of the gate layer 22.

In some embodiments, the device further includes a cap layer 23 located on the gate layer 22 and used for protecting the gate layer 22. The material of the cap layer 23 includes, but is not limited to, silicon oxide, silicon nitride, etc.

In some embodiments, the structure, such as a buffer layer is also formed between the substrate 20 and the gate insulating material layer 21, which are not limited herein.

In some embodiments, a side wall structure is also formed by side walls of the gate layer 22 and the gate insulating layer 21 for protecting the gate layer 22 and the gate insulating layer 21. In addition, the side wall structure is also used for maintaining the electrical insulation between the gate layer 22 and other structures. The material of the side wall includes, but is not limited to, silicon nitride (SiN), silicon carbide (SiC), etc.

The gate insulating layer 21 and the gate layer 22 may be formed by using one or more thin film deposition processes. Specifically, the thin film deposition process includes, but is not limited to, a CVD process, a PECVD process, an ALD process, or a combination thereof. The gate insulating layer 21 may be made of a high dielectric constant material, which includes, but is not limited to, silicon oxide and other materials. The gate insulating layer 21 can provide electrical insulation between the subsequently formed gate layer 22 and the substrate 20.

With continuing reference to FIG. 5, a distance between the first end 21a and the second end 21b of the gate insulating layer 21 is L1, and is equal to the channel length. That is, the channel length is L1.

In one embodiment, the gate layer 22 includes a polysilicon layer 221 and a metal layer 222, and the polysilicon layer 221 and the metal layer 222 have a same length in a direction parallel to the channel length. The first end 22a of the gate layer 22 includes a first end 221a of the polysilicon layer 221 and a first end 222a of the metal layer 222. The second end 22b of the gate layer 22 includes a second end 221b of the polysilicon layer 221 and a second end 222b of the metal layer 222. In the embodiment, the first end 222a of the metal layer 222 is flush with the first end 221a of the polysilicon layer 221 in a perpendicular direction, and the second end 222b of the metal layer 222 is flush with the second end 221b of the polysilicon layer 221 in the perpendicular direction. That is, the polysilicon layer 221 and the metal layer 222 have the same length. The material of which the metal layer 222 is made includes, but is not limited to, metal tungsten, metal silicide, tungsten nitride, etc. The metal silicide may be $TiSi_2$, $CoSi_2$, $NiSi_2$, etc.

In one embodiment, both the first end 22a and the second end 22b of the gate layer 22 include an oxidation layer 223 formed during the reoxidation process. That is to say, the oxidation layer 223 also is located, at the first end 221a of the polysilicon layer 221 and the first end 222a of the metal layer 222, and the second end 221b of the polysilicon layer 221 and the second end 222b of the metal layer 222.

In one embodiment, a thickness of the oxidation layer 223 in a direction parallel to the channel length is less than or equal to the preset length ΔL. In the embodiment, the preset length ΔL indicates a numerical value of the distance inwards which the first end 21*a* of the gate insulating layer 21 is recessed relative to the first end 22*a* of the gate layer 22, or the second end 21*b* of the gate insulating layer 21 is recessed relative to the second end 22*b* of the gate layer 22.

It should be understood that the length of the gate layer, and the length of the polysilicon layer and the length of the metal layer which are included in the gate layer involved in embodiments of the disclosure are not specifically limited, and are flexibly arranged according to actual process requirements. Moreover, the thickness of the oxide layer formed after performing the reoxidation process on the gate layer is not limited, and is flexibly arranged according to actual process requirements. The gate stack structure involved in embodiments of the disclosure can be applied in a DRAM structure or other semiconductor devices, which are not limited herein.

In conclusion, according to embodiments of the disclosure, two ends of the gate insulating layer are recessed inwards by the preset length ΔL relative to two ends of the gate layer, respectively. After performing the reoxidation process, the oxidation layer is formed on the side wall of the gate layer, and does not cover the gate insulating layer, so that the finally formed gate stack structure does not decrease the length of the effective channel length due to the formation of the oxidation layer on the side wall of the gate layer. Compared to the contents in the prior art in FIG. 1C, the technical solutions provided in embodiments of the disclosure solve the problem of the decrease of the effective channel length due to the oxidation of the side wall of the gate layer after the reoxidation process, thereby improving the operation stability of the semiconductor device.

In addition, by designing the temperature and duration time required for the reoxidation process, the first end and the second end of the gate layer are sufficiently oxidized to form the oxidation layer, which avoids the problem of further oxidation caused by insufficient oxidation of the side wall of the gate layer in subsequent processes.

It should be noted that the embodiments of the method for manufacturing a semiconductor device, and the embodiments of the semiconductor device provided by the disclosure relate to the same concept. The technical features in the technical solutions described in the embodiments may be combined with each other in the case of no conflict.

The foregoing descriptions are merely preferred embodiments of the disclosure, and are not intended to limit the scope of protection of the disclosure. Any modification, equivalent replacement, improvement and the like made within the spirit and principle of the disclosure shall fill within the scope of protection of the disclosure.

INDUSTRIAL APPLICABILITY

Embodiments of the disclosure provide a method for manufacturing a semiconductor device, and a semiconductor device. The method includes: forming a gate insulating material layer on a substrate; forming a gate material layer on the gate insulating material layer; and performing an etching process on the gate material layer and the gate insulating material layer to form a gate layer and a gate insulating layer. The gate insulating layer and the gate layer each include a first end and a second end opposite to each other in a direction parallel to a channel length. The first end of the gate insulating layer is recessed inwards by a preset length relative to the first end of the gate layer, and the second end of the gate insulating layer is recessed inwards by the preset length relative to the second end of the gate layer, in this way, when the subsequent reoxidation process is performed, the first end and the second end of the gate layer are oxidized to form an oxidation layer, which does not cover the gate insulating layer. Therefore, the actual length of the gate is greater than or equal to the length of the gate insulating layer, which would not cause the decrease of an effective channel length.

The invention claimed is:

1. A semiconductor device, comprising:
a substrate;
a gate insulating layer located on the substrate, and comprising a first end and
a second end opposite to each other in a direction parallel to a channel length; and
a gate layer located on the gate insulating layer, and comprising a first end and a second end opposite to each other in a direction parallel to the channel length;
wherein the first end of the gate insulating layer is recessed inwards by a preset length relative to the first end of the gate layer, and the second end of the gate insulating layer is recessed inwards by the preset length relative to the second end of the gate layer;
wherein the first end and the second end of the gate layer each comprise an oxidation layer formed in a reoxidation process, and the oxidation layer does not cover the gate insulating layer;
wherein a thickness of the oxidation layer in the direction parallel to the channel length is equal to the preset length.

2. The device of claim 1, wherein a distance between the first end and the second end of the gate insulating layer is equal to the channel length.

3. The device of claim 1, wherein the gate layer comprises a polysilicon layer and a metal layer located on the polysilicon layer, the polysilicon layer and the metal layer have a same length in the direction parallel to the channel length, wherein the oxidation layer comprises metal oxide and silicon oxide.

4. The device of claim 1, wherein the device further comprises: a cap layer located on the gate layer.

* * * * *